United States Patent [19]
Kurosawa

[11] Patent Number: 5,157,496
[45] Date of Patent: Oct. 20, 1992

[54] PORTABLE TELEVISION RECEIVER EQUIPPED WITH REMOTE CONTROLLER

[75] Inventor: Kazuyuki Kurosawa, Tokyo, Japan

[73] Assignee: Casio Computer Co., Ltd., Tokyo, Japan

[21] Appl. No.: 581,478

[22] Filed: Sep. 11, 1990

[30] Foreign Application Priority Data

Sep. 25, 1989 [JP] Japan .............................. 1-111759[U]
Sep. 25, 1989 [JP] Japan .................................. 1-248910
Sep. 25, 1989 [JP] Japan .................................. 1-248911
Oct. 24, 1989 [JP] Japan .............................. 1-123633[U]

[51] Int. Cl.⁵ ........................................... H04N 5/44
[52] U.S. Cl. .............................. 358/194.1; 358/192.1; 340/706; 340/717
[58] Field of Search ............... 358/194.1, 193.1, 191.1, 358/192.1; 455/603, 352, 353; 340/706, 717

[56] References Cited

U.S. PATENT DOCUMENTS

| | | | |
|---|---|---|---|
| 4,041,400 | 8/1977 | Watts | 455/353 |
| 4,430,669 | 2/1984 | Cheung | 358/193.1 |
| 4,566,034 | 1/1986 | Harger et al. | 455/353 |
| 4,591,914 | 5/1986 | Hakamada et al. | 358/194.1 |
| 4,600,948 | 7/1986 | Dangschat | 358/194.1 |
| 4,751,574 | 6/1988 | Mogi et al. | 358/194.1 |
| 4,837,627 | 6/1989 | Mengel | 358/191.1 |
| 4,855,833 | 8/1989 | Kageyama et al. | 358/191.1 |
| 4,914,517 | 4/1990 | Duffield | 358/191.1 |
| 4,954,899 | 9/1990 | Tanabe et al. | 358/194.1 |
| 4,959,720 | 9/1990 | Duffield et al. | 358/194.1 |

FOREIGN PATENT DOCUMENTS 0026757 2/1980 Japan .............................. 358/192.1
0232686 9/1988 Japan .
0238776 10/1988 Japan .

Primary Examiner—John K. Peng
Assistant Examiner—Jeffrey S. Murrell
Attorney, Agent, or Firm—Frishauf, Holtz, Goodman & Woodward

[57] ABSTRACT

A portable television receiver system including a remote controller wherein, key functions of the remote controller are displayed on a display screen of the television receiver in relation to key positions of the remote controller, and wherein channel selecting sequences are varied in the remote controller and portable television receiver.

16 Claims, 15 Drawing Sheets

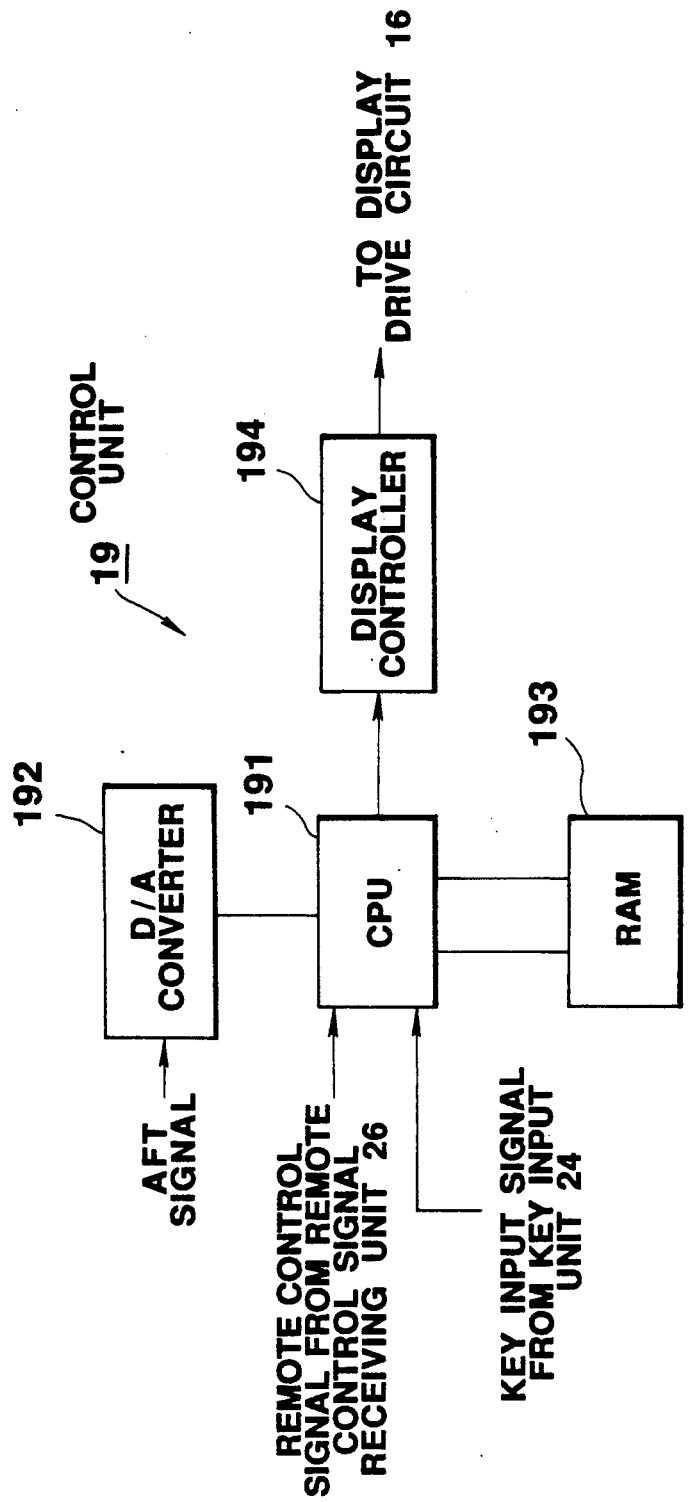

| ADDRESS | CONTENT |
|---|---|
| 1 | CHANNEL NUMBER OF CHANNEL SELECTING KEY A |
| 2 | CHANNEL NUMBER OF CHANNEL SELECTING KEY B |
| 3 | CHANNEL NUMBER OF CHANNEL SELECTING KEY C |
| 4 | CHANNEL NUMBER OF CHANNEL SELECTING KEY D |
| 5 | CHANNEL NUMBER OF CHANNEL SELECTING KEY E |
| 6 | CHANNEL NUMBER OF CHANNEL SELECTING KEY F |
| 7 | CHANNEL NUMBER OF CHANNEL SELECTING KEY G |
| 8 | CHANNEL NUMBER OF CHANNEL SELECTING KEY H |
| 9 | CHANNEL NUMBER OF CHANNEL SELECTING KEY I |
| 10 | CHANNEL NUMBER OF CHANNEL SELECTING KEY J |
| 11 | CHANNEL NUMBER OF CHANNEL SELECTING KEY K |
| 12 | CHANNEL NUMBER OF CHANNEL SELECTING KEY L |

FIG. 4

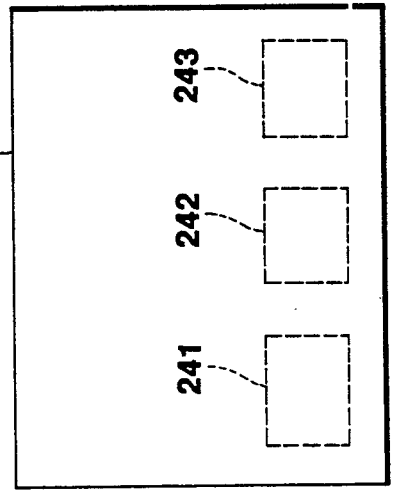
FIG.9a
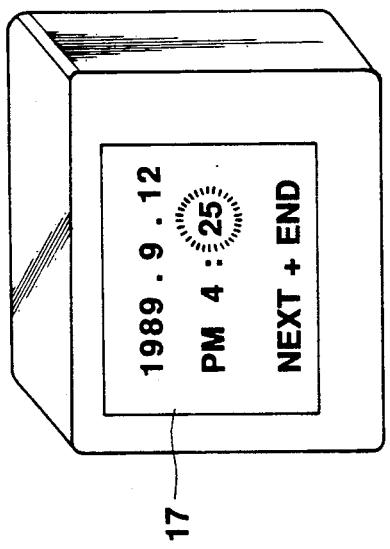
FIG.9b
FIG.9c

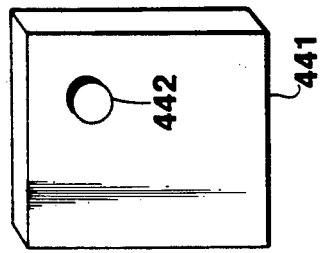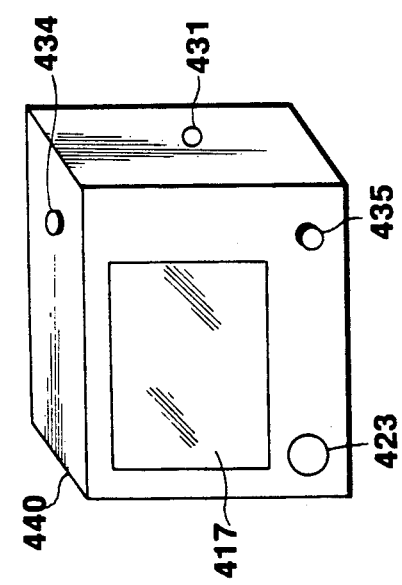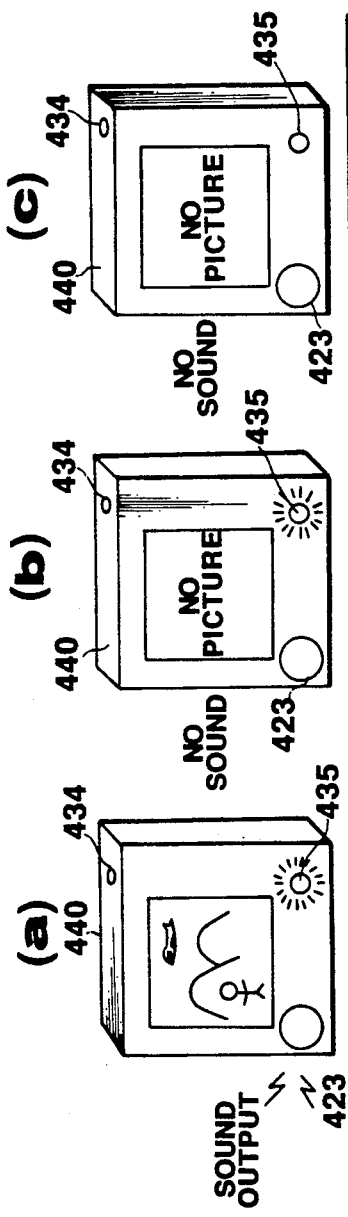

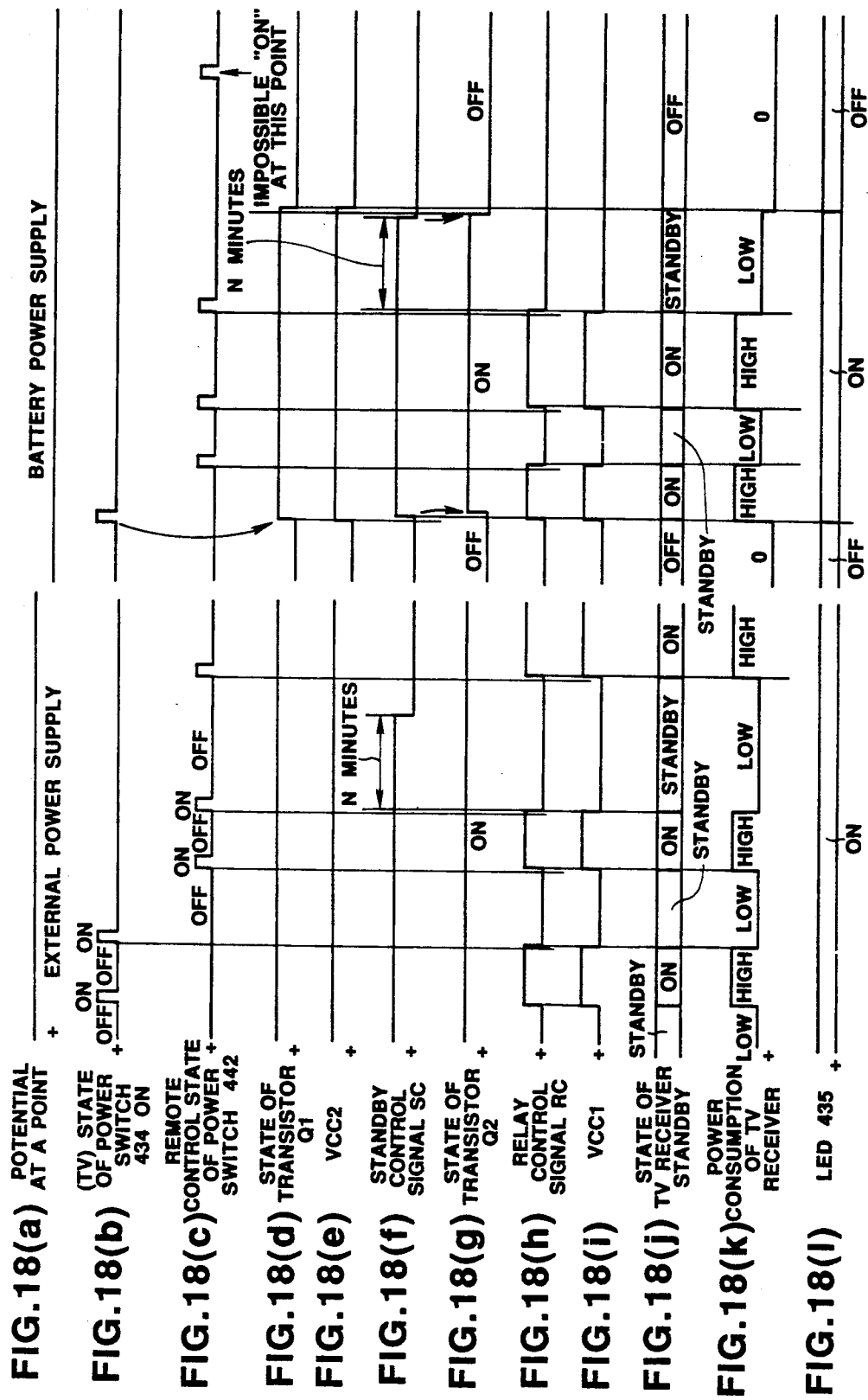

PORTABLE TELEVISION RECEIVER EQUIPPED WITH REMOTE CONTROLLER

BACKGROUND OF THE INVENTION

Conventional home type television receivers, they are equipped with remote controllers. The function of this remote controller is to remotely control various functions of this home type television receiver. As such a remote controlling function, for instance, a power switch of the television receiver is turned ON/OFF. Further, a plurality of channel selection keys are provided on the remote controller, and television broadcasting stations are allocated to the respective channel selecting keys, so that labels indicative of the channel numbers of the relevant broadcasting stations which have been allocated to the respective channel selecting keys, are attached to the corresponding channel selecting keys. Thus, the channel selecting operations are carried out in accordance with the attached labels. In portable type television receivers, since the size of the entire TV receiver is rather small as compared with the home type TV receiver and a larger number of function keys are not so readily provided on the portable TV receiver, a remote controller is very useful.

However, as it is very common to transport such a portable TV receiver in an automobile, there are great differences in receivable TV broadcasting stations. In such a case, if a so-called "auto-preset" function (i.e., function capable of presetting a receivable TV station) is equipped in the main body of the portable TV receiver, the above-described problem may be solved to some extent. However, there is still a difficulty in a remote controller in that the TV broadcasting stations must be newly allocated to the respective channel selecting keys and moreover labels indicative of the newly allocated channel numbers are required to be attached to the respective channel selecting keys.

Also, there is another problem that since the portable TV receiver is normally operated by the built-in battery, if the remote control signal receiving circuit of the remote controller is operated when no TV program is watched, useless power consumption may occur.

Furthermore, since the size of the entire portable television receiver is rather small, no channel selecting key for directly designating TV channels is provided in this portable TV receiver. Alternatively only two set keys are provided to increase/decrease the frequencies of the channels. As to this two-key channel selecting method, there are several methods whereby a preset channel is set upwardly or downwardly, a TV channel frequency is continuously increased/decreased, and so on. However, there is no way to select one channel selecting method to other channel selecting methods.

SUMMARY OF THE INVENTION

The present invention has been made in an attempt to solve the above-described problems, and therefore has an object to provide a portable television receiver equipped with a useful remote controller.

To achieve the above-described object, a portable television receiver equipped with a remote controller comprises:

a remote controller including at least a plurality of channel designating keys, for transmitting remote control signals corresponding to said plurality of channel designating keys;

allocation means for allocating information on broadcasting stations, to the remote control signals corresponding to said channel designating keys; and, display means for displaying a relationship between said channel designating keys and said information allocated to the remote control signals of said channel designating keys.

In accordance with the portable television receiver with the above-described arrangement, even such a remote controller employed for the portable TV receiver can have a sufficiently useful function, as compared with that of the home type television receiver.

BRIEF DESCRIPTION OF THE DRAWINGS

FIG. 3 is a schematic block diagram for representing a detailed control unit shown in FIG. 1, according to the first preferred embodiment;

FIG. 4 is a schematic block diagram for representing a detailed content of RAM shown in FIG. 3;

FIGS. 9a–9c illustrate a display example of the portable television receiver according to the second preferred embodiment;

FIG. 16 is a perspective view of a portable television receiver according to a fourth preferred embodiment of the present invention;

FIG. 17 is a perspective view of a remote controller according to the fourth preferred embodiment;

FIGS. 18(a)–18(l) are timing charts for explaining an operation of the television receiver according to the fourth preferred embodiment; and FIGS. 19(a)–19(d) are illustrations for representing a relationship between power source conditions of the portable television receiver and reception conditions for the remote controller according to the fourth preferred embodiment.

DETAILED DESCRIPTION OF THE PREFERRED EMBODIMENTS

ARRANGEMENT OF FIRST PORTABLE TV RECEIVER HAVING PRESET FUNCTION

Referring now to FIGS. 1 through 7, an arrangement of a portable television receiver according to a first preferred embodiment of the present invention will be described.

Figure 1:
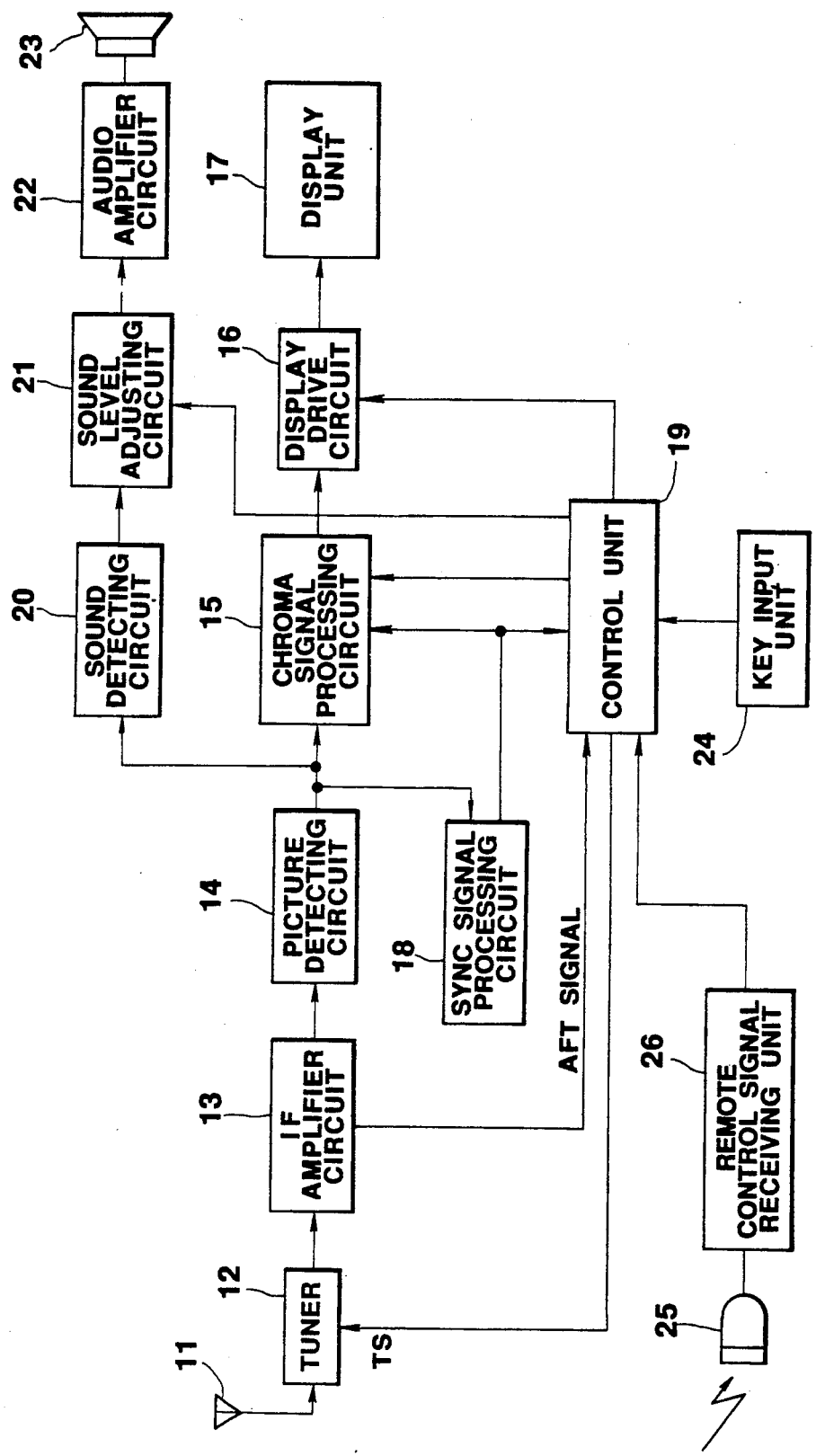
FIG. 1 is a schematic block diagram of an overall circuit arrangement for a portable television receiver according to first to third preferred embodiment of the present invention.

In FIG. 1 there is shown a schematic block diagram of an overall arrangement of the portable TV receiver. An antenna 11 is employed to receive television broadcasting electromagnetic waves (otherwise, simply referred to as "TV channel signals"). The received TV channel signals are inputted into a tuner 12. The tuner 12 selects a designated TV channel signal in response to a tuning signal "TS" delivered from a control unit 19, and converts the selected TV channel signal into a corresponding intermediate frequency signal which will then be supplied to an intermediate amplifier circuit 13. The function of the intermediate frequency amplifier circuit 13 is to amplify the intermediate frequency signal sent from the tuner 12 so as to output the amplified IF (intermediate frequency) signal to a picture detecting circuit 14, and also to AFT-detect a portion of this amplified IF signal to produce an AFT (automatic frequency tuning) signal which will be outputted to the control unit 19. The picture detecting circuit 14 detects the IF signal supplied from the IF amplifier circuit 13 and outputs the picture detected IF signal to both a chroma (chrominance) signal processing circuit 15 and also a sync (synchronous) signal processing circuit 18. The sync signal processing circuit 18 separates a horizontal sync signal and a vertical sync signal from the picture signal furnished from the picture detecting circuit 14, and outputs both of these sync signals to the chroma signal processing circuit 15 and control unit 19. Also to the chroma signal processing circuit 15, a control signal is supplied from the control unit 19.

In response to the sync signal from the sync signal processing circuit 18 and the control signal from the control unit 19, the chroma signal processing circuit 15 performs a chroma signal processing for the picture signal to output three color signals R, G and B to a display drive circuit 16. The display drive circuit 16 drives a display unit 17 in response to a timing signal and a luminance signal furnished from the control unit 19. A color liquid crystal display panel, for instance, may be utilized as this display unit 17.

A portion of the output signal from the picture signal detecting circuit 14 is sent to a sound detecting circuit so as to be sound-detected, thereby producing a sound or audio signal. The audio signal is thereafter supplied to a sound level adjusting circuit 21. The sound level of this audio signal is adjusted and then supplied to an audio amplifier circuit 22, whereby a television sound is produced from a speaker 23.

A key input unit 24 is also connected to the control unit 19. There are provided on this key input unit 24, up/down keys for selecting TV channels; up/down keys for controlling the sound level; up/down keys for controlling the luminance level; power ON/OFF switch; and so on.

Figure 2:
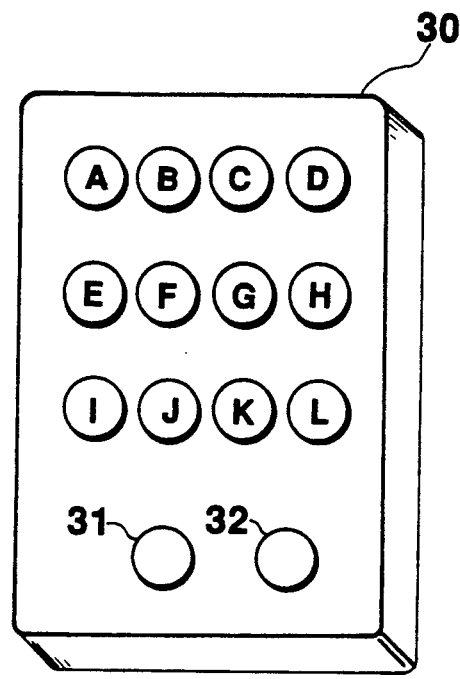
FIG. 2 is a perspective view of a remote controller according to the first preferred embodiment.

A remote control signal transmitted from a remote control transmitter 30 shown in FIG. 2 is inputted via a remote control signal light receiving unit 25 and a remote control signal receiving unit 26 to the control unit 19 shown in FIG. 1 in accordance with the first preferred embodiment. On this remote control transmitter 30, there are employed, for example, 12 TV channel selecting keys "A" to "L" in a matrix arrangement of 3 lines×4 columns, a preset channel number display key 31 and an autopreset key 32. Further, up/down keys for controlling the sound level (not shown) are provided on the remote control transmitter 30. When various key operations are performed for the channel selecting keys "A" to "L", the preset channel number display key 31, and autopreset key 32, the remote control transmitter 30 transmits various control signals of, e.g., infrared signals in accordance with the key operations.

With the above-described arrangement, the control unit 19 performs the various control operations for the respective circuit units in response to the signals derived from either the key input unit 24 or remote control transmitter 30. For instance, a tuning signal "TS" is supplied to the tuner 12, a sound level adjusting signal is sent to the sound level adjusting signal 21, and a preset channel number display signal is furnished to the display drive circuit 16.

CONSTRUCTION OF CONTROL UNIT

Figure 5:
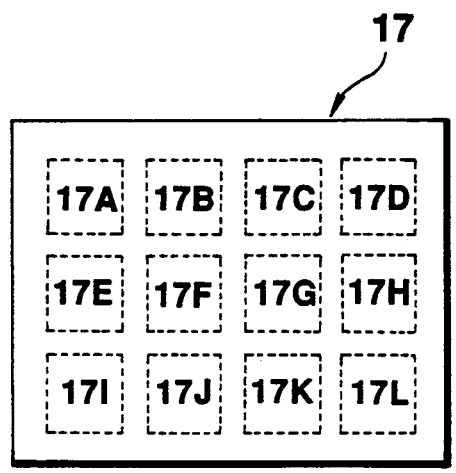
FIG. 5 illustrates a display region of a preset channel number displayed on a television screen in the first preferred embodiment.
Figure 6:
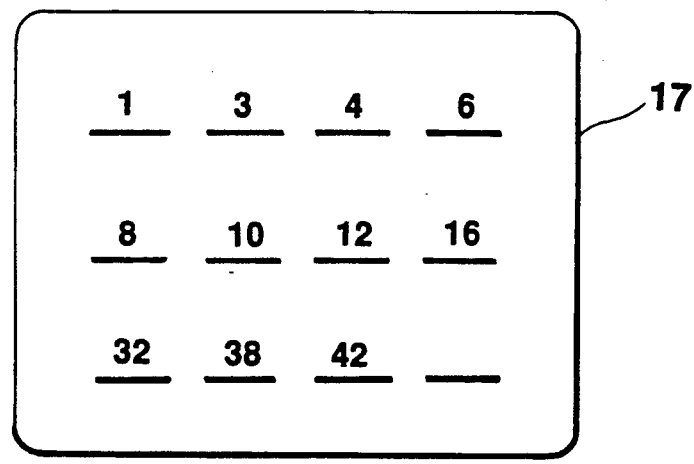
FIG. 6 illustrates a display example of a preset channel number displayed on a television screen in the first preferred embodiment.

FIG. 3 represents a construction of a major unit of the above-described control unit 19. A central processing unit (CPU) 191 is employed in the control unit 19 shown in FIG. 3. The key input signal from the key input unit 24 and the remote control signal from the remote control signal receiving unit 26 are inputted into this CPU 191, and also the AFT signal which has been sent from the intermediate frequency amplifier circuit 13 is inputted via an A/D (analog-to-digital) converter 192. Both a RAM (random access memory) 193 and a display controller 194 are connected to the CPU 191. Into this RAM 193, the preset channel numbers of the channel selecting keys "A" to "L" are written at, for example a first address to a 12th address. When the preset channel number display key 31 of the remote control transmitter 30 is manipulated, the CPU 191 sends a display drive signal via the display controller 194 to the display drive circuit 16 in accordance with the preset contents of the RAM 193, whereby the preset channel number is displayed on the display screen of the display unit 17 employed in the portable TV receiver in a superimposing form. In this case, according to the first preferred embodiment, in the display screen of the display unit 17, there are provided 12 display regions 17A to 17L in a 3-line×4-column matrix form. The respective display regions 17A to 17L correspond to the arrangements of the channel selecting keys "A" to "L" of the remote control transmitter 30. Then, the preset channel numbers are displayed on the corresponding display regions 17A to 17L, as represented in FIG. 5. As illustrated in FIG. 6, bars indicative of the channel selecting keys "A" to "L" are displayed on the respective display regions 17A to 17L displayed on the display screen, and thus the relevant preset channel numbers are displayed above the bars.

PRESET OPERATION/PRESET CHANNEL NUMBER DISPLAY BY FIRST TV RECEIVER

Referring now to a flowchart shown in FIG. 7, the present operation of the TV channels and present channel number display in the portable TV receiver according to the first preferred embodiment will be described.

In a case where a predetermined television channel is preset in the first portable TV receiver shown in FIG. 1, the autopreset key 32 employed on the remote control transmitter 30 is operated. When the preset channel number is displayed, the preset channel number display key 31 is operated. When the above-described preset key 32 and number display key 31 are operated, signals corresponding to these key operations are transmitted from the remote control transmitter 30 via the remote control signal light receiving unit 25 and remote control signal receiver unit 26 to the CPU 191 (see FIG. 3) employed in the control unit 19, and then the process as represented in the flowchart of FIG. 7 is executed under control of this CPU 191.

Figure 7:
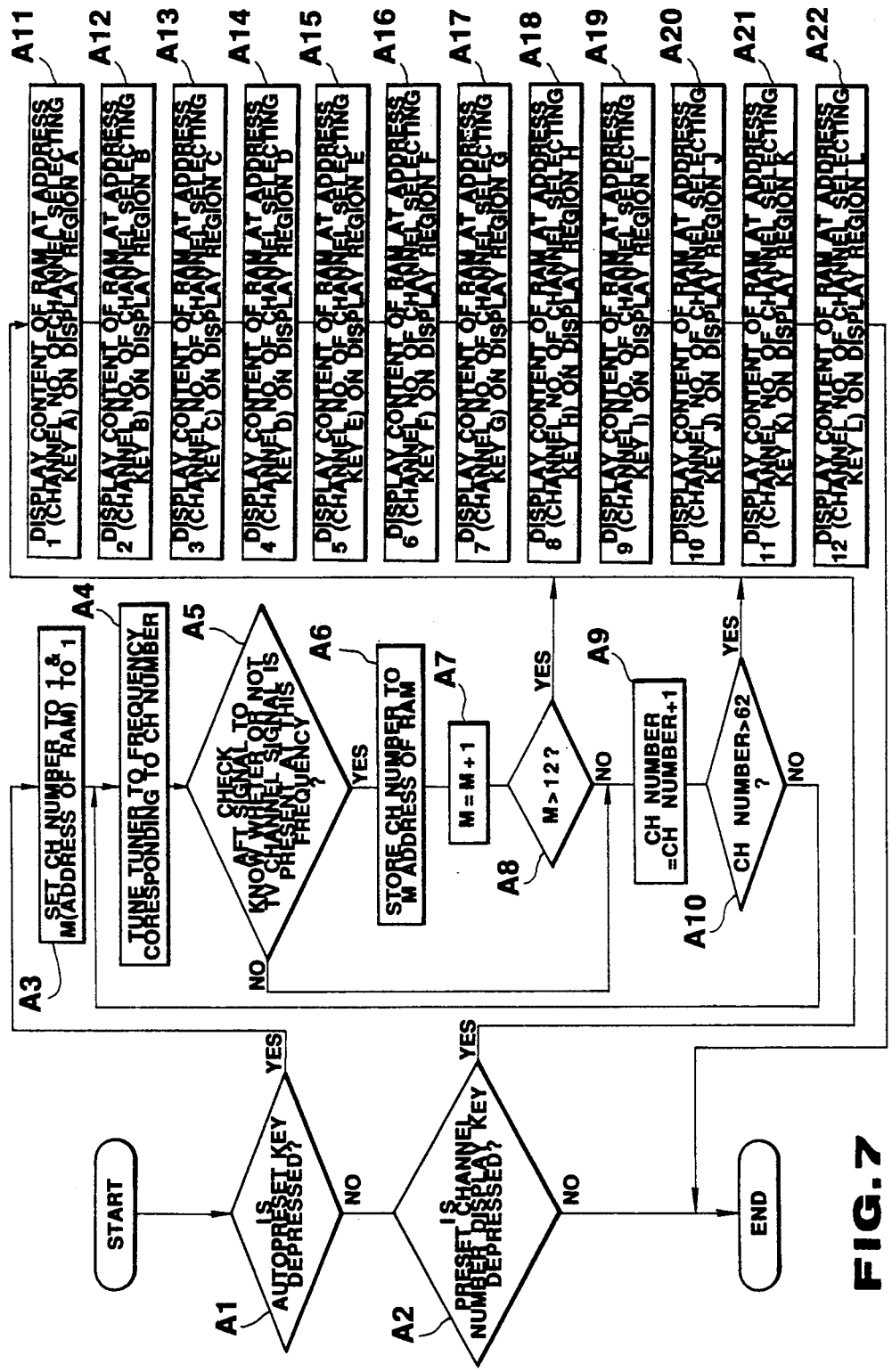
FIG. 7 is a flowchart for explaining both a preset operation and a display operation of the channel number according to the first preferred embodiment.

The key operations by the autopreset key 32 and preset channel number display key 31 are detected at steps A1 and A2 shown in FIG. 7. Assuming now that the automatic preset key 32 is operated, this key operation is detected at the step A1 and then a process as defined after a step A3 is executed. First, a channel number is set to "1" and a designated address "M" of the RAM 193 is set to "1" (a step A3). This RAM 193 has a memory capacity addressed from a first address to a twelfth address, and these addresses correspond to the channel selecting keys "A" to "L".

Subsequently, the tuner 12 is tuned to the channel number, i.e., the frequency corresponding to the first TV channel in this case (a step A4), and judges whether or not there exists a television broadcasting electromagnetic wave at this frequency by checking the relevant AFT signal (a step A5). If the relevant broadcasting electromagnetic wave is present, then the received channel number at this case is stored into an Mth address of the RAM 193 (a step A6). In this case, the first channel is stored at the first address of the RAM 193. Thereafter, the designated address "M" of the RAM 193 is increased (a step A7), and a judgment is made whether or not the increased value of "M" becomes larger than "12" (a step A8). At this time, since M=2 and thus the increase value of M is smaller than 12, the process is advanced to a next step A9 at which the channel number is increased by "1". Further, at a step A10, a check is made whether or not the designated channel number at this time becomes larger than a maximum channel number, for instance, "62". If this designated channel number is smaller than 62, the process is returned to a step A4, at which as previously described, the tuner 12 is tuned to the designated channel number, namely a frequency corresponding to the second channel and a judgment is made whether or not there exists a desired TV broadcasting electromagnetic wave by investigating the AFT signal. In case that there is no TV broadcasting electromagnetic wave at this second channel, no process as defined at steps A6, A7 and A8 is performed and the process is advanced to a step A9 at which the present channel number is increased by 1.

While similarly repeating the processes defined in the steps A4 to A10, the preset channel numbers corresponding to the channel selecting keys "A" to "L" are stored in the relevant addresses of RAM 193. Then, in case that a judgment is made that the value of M becomes "12", in other words, when the preset operations of the channel numbers have been accomplished from the first address to the twelfth address of the RAM 193, a display process as defined in steps A11 to A22 is performed. Even if there is such a condition that the preset numbers have not been stored at all of the addresses, namely first to twelfth addresses of the RAM 193, when a judgment is made that the designated channel number exceeds the maximum channel number at a step A10, the display process as defined at the steps A11 to A22 is executed. That is, when the receivable channel number is smaller than 12, if the judgment result at the step A10 becomes "YES", the process is advanced to the steps A11 to A22 where the display process is performed.

DISPLAY PROCESS OF FIRST TV RECEIVER

In accordance with the display process as defined at the steps A11 to A22, the CPU 191 reads out the memory contents which have been stored at the first address to the twelfth address of the RAM 193, namely the channel numbers which wave been preset with respect to the channel selecting keys "A" to "L", and transfers the read channel number via the display controller 194 to the display drive circuit 16, so that the channel number is displayed on the relevant display region 17A through 17L of the display screen, as represented in FIGS. 4 and 6. FIG. 6 represents such conditions that the first channel (1 CH) is allocated to the channel selecting key A, the third channel (3 CH) is allocated to the channel selecting key B, and similarly the following channels are allocated to the corresponding channel selecting keys, i.e., C=4 CH; D=6 CH; E=8 CH, F=10 CH, G=12 CH, H=16 CH: I=32 CH; J=38 CH; and K=42 CH; and also no channel number has been allocated to the channel selecting key "L". It should be noted that as previously stated, the preset data displayed on the display screen is erased by operating, for instance, the reset key on the like, otherwise is automatically erased after a predetermined time period has elapsed. Then, the normal received image display condition is realized.

When confirmation is later made of the channel number which has been preset in accordance with the above-described preset operation, the preset channel number display key 31 is operated. The CPU 191 detects this operation of the preset channel number display key 31 at the step A2 of the flowchart shown in FIG. 7. The process is immediately advanced to the display process at the steps A11 to A22 and the preset channel number is displayed on the screen of the display unit 17, as shown in FIG. 6. This display data is erased by operating the reset key and the like, which is similar to the erasing operation during the preset operation, or is automatically erased after a predetermined time period has passed, and the normal received image display condition is recovered.

With the above-described operations, both the preset process and the display process of the preset data with respect to the channel selecting keys "A" to "L" are accomplished.

It should be noted that in the above-described first preferred embodiment, the channel numbers for the broadcasting stations have been allocated with respect to the plural channel selecting keys to the remote control transmitter 30. Alternatively, in such a case that a plurality of channel selecting keys may be employed at the body side of the portable television receiver so as to allocate the channel numbers of the corresponding broadcasting stations, the inventive idea of the first portable television receiver may be similarly realized.

As previously described in detail, in accordance with the first preferred embodiment of the present invention, in the portable television receiver having such a channel number preset function that a plurality of receivable TV broadcasting channels are allocated to a plurality of channel selecting keys in one-to-one correspondence, there is employed the memory for storing therein the corresponding relationship between the channel selecting keys and preset channel numbers. When an instruction is made of the display of the preset channel number, the preset number which has been stored in this memory is read out and then displayed on the display screen in accordance with the key arrangement of the plural channel selecting keys. As a result, only the key for displaying the preset channel number is operated with one-touch key operation, whereby the preset channel number is displayed on the display screen in relation to the respective channel selecting keys. Accordingly, even when the preset channel numbers are frequently changed in such as a portable television receiver, the preset channel number may be readily confirmed from the display screen.

ARRANGEMENT OF SECOND PORTABLE TV RECEIVER INCLUDING FUNCTION KEY

A description will now be made of another portable TV receiver including a function key, according to a second preferred embodiment of the present invention, with reference to FIGS. 1 and 8 to 10. It should be noted that since an overall arrangement of this second portable television receiver is substantially the same as that of the previously described first preferred embodiment, only different circuit portions thereof will now be described.

Figure 8:
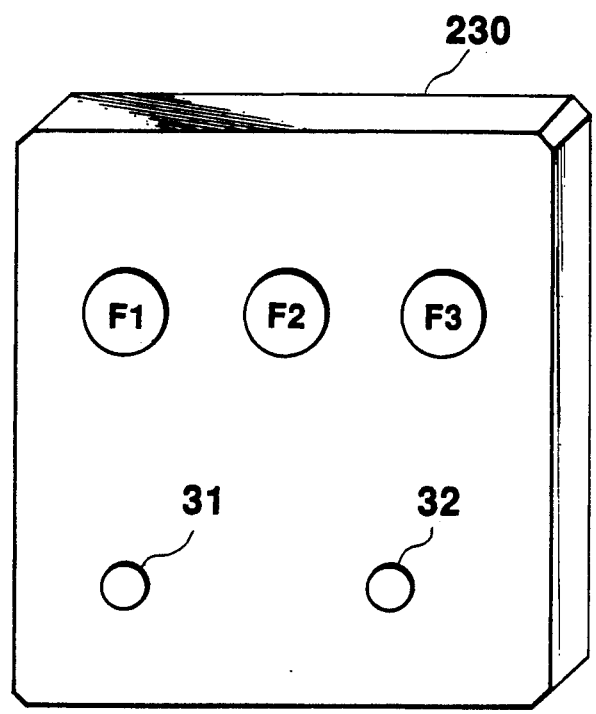
FIG. 8 is a perspective view of a remote controller according to the second preferred embodiment.

In accordance with the second preferred embodiment, to the control unit 19 shown in FIG. 1, a remote control signal transmitted from a remote control transmitter 230 shown in FIG. 8 is inputted via the remote control signal light receiving unit 25 and remote control signal receiving unit 26. Function keys F1, F2 and F3 are provided on the above-described remote control transmitter 230, and also an operation mode instruction key, for instance, a timer adjusting key 231 and a calendar display key 232. Although not being shown in FIG. 8, other function keys, e.g., a channel selecting key, sound level adjusting key and the like are provided on this remote control transmitter 230. The remote control transmitter 230 transmits the remote control signal of, e.g., infrared light in response to the above-described key operation.

Then, the control unit 19 performs various control operations in response to the remote control signal transmitted from either the key input unit 24 or the remote control transmitter 230, for instance, sends a tuning signal TS to the tuner 12; a sound level adjusting signal to the sound level adjusting circuit 21; and, a luminance adjusting signal to the display drive circuit 16. Also, the control unit 19 is equipped with both a timer function and a calendar function. Upon operation of the timer adjusting key 231 employed in the remote control transmitter 230, a timer adjusting mode is instructed, and information on year, month, day and present time on this day is outputted to the display drive circuit 16 so as to be displayed on the display unit 17, as represented in FIG. 9a. Upon manipulation of the calendar display key 232, the calendar display mode is designated and thus calendar information on this month or designated month is outputted to the display drive circuit 16 so as to be displayed on the display unit 17, as shown in FIG. 9b. The control unit 19 has stored the calendar information of several years as the calendar function. Then, while displaying the above-described time instant display screen and calendar display screen, either the timer adjustment or calendar display is switched by operating the function keys F1 to F3.

TIMER/CALENDAR FUNCTIONS

Figure 10:
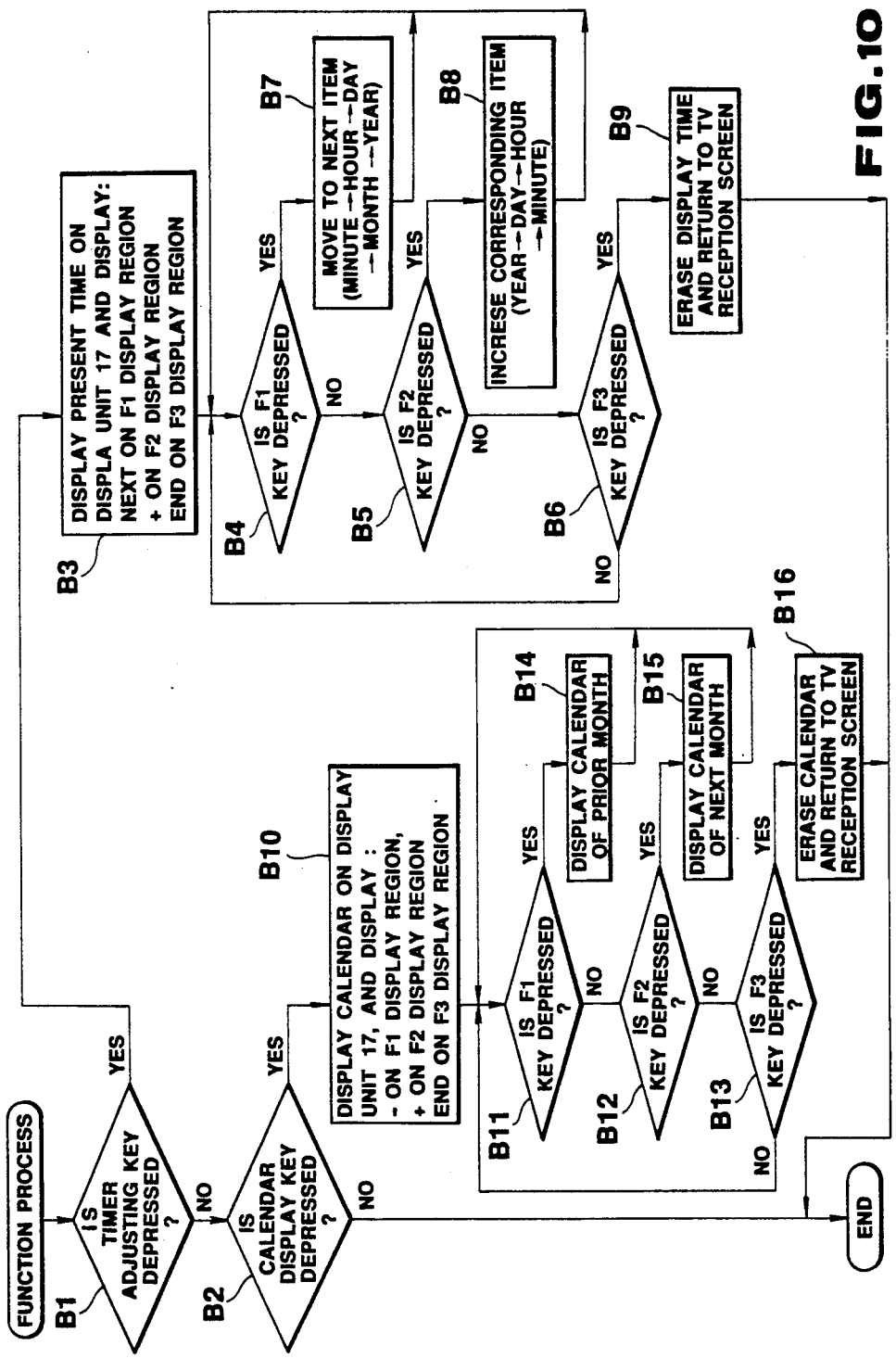
FIG. 10 is a flowchart for representing a time adjustment and a calendar display operation according to the second preferred embodiment.

Referring now to a flowchart shown in FIG. 10, detailed control operations for the timer function and calendar function under the control of the control unit 19 will be described. When the timer is adjusted, the timer adjusting key 231 employed on the remote control transmitter 230 is operated under condition that the power source is turned ON. When the calendar is displayed, the calendar display key 232 is operated. Upon operation of the timer adjusting key 231, or calendar display key 232, the control unit 19 commences the function control operation as defined at the flowchart shown in FIG. 10. At steps B1 and B2, a detection is made whether or not the timer adjusting key 231 or calendar display key 232 is operated. In case that the timer adjusting key 231 is operated, this key operation is detected at the step B1, and the process is advanced to a step B3. At this step B3, both the timer information and function information are outputted from the control unit 19 to the display drive circuit 16. The display drive circuit 16 accepts the information sent from the control unit 19 instead of the television signal during the timer display mode, displays the year, month, day and present time instant (hour, minute) on the display unit 17 as represented in FIG. 9a, and the function information thereon. In FIG. 9a, "1989. 9. 12" is represented as the year, month and day information, whereas "4:25" is indicated as the present time instant information (hour, minute). With respect to the first time instant representation, the "minute" unit representation is flashed, whereby the item to be adjusted in this case implies "minute".

On the other hand, the function information is displayed at, for instance, a lower portion of the display screen. Precisely speaking, as represented in FIG. 9c, function display regions which correspond to the positions of the function keys F1, F2 and F3 in one-to-one correspondence, are preset at the lower portion of the screen in the display unit 17, namely an F1 display region 241, an F2 display region 242, and an F3 display region 243. The various function information are displayed on the respective display regions 241 to 243. For instance, as illustrated in FIG. 9a, a character "NEXT" indicative of the function of the function key F1 is displayed on the display region 241, a symbol "+" representative of the function of the function key F2 is represented on the F2 display region 242, and a character "END" indicating the function of the function key F3 is represented on the F3 display region 243. That is to say, in the timer adjusting mode, the function key F1 has such a function to designate a next item; the function key F2 has such a function to increase time instant information of a designated item by 1; and the function key F3 includes a function to end the timer adjusting process, which are displayed on the display screen.

The key operations by the function keys F1 to F3 are detected at the steps B4 to B6, and a process defined at steps B7 to B9 is performed in accordance with the detected results. Upon detection of the key operation of the function key F1, the process is advanced to the step B7, at which an object to be adjusted is moved to a subsequent item and this item is displayed in the flashing mode. In this case, the item of the adjusting object is sequentially moved in this order of "minute", "hour", "day", "month" and finally "year". Then, after one item has moved, the process is returned to the previous step B4 for preparing the subsequent key operation.

When the timer adjusting mode is effective, the item being displayed in the flashing mode is moved to the item to be adjusted by operating the first function key F1, and then the second function key F2 is operated. Once this function key F2 is manipulated, this key operation is detected at the step B5 and the process is advanced to the step B8 at which the relevant item is increased by 1. Thereafter, the process is returned to the step B4. As previously described, every time the second function key F2 is operated, the value of the item to be selected is successively increased by 1, so that this function key F2 is operated until the displayed time instant is coincident with the present time instant. Similarly, the timer adjustment is carried out in this order of "minute", "hour", "day", "month" and "year" by way of the combination operation of the first and second function F1 and F2.

Then, after the above-described timer adjustment has been accomplished, when the third function key F3 is operated, this key operation is detected at the step B6, and the process defined at the step B9 is performed. At this step B9, the control instruction is transferred from the control unit 19 to the display drive circuit 16 in order to erase the time instant displayed on the display screen, whereby the normal television image display condition is recovered.

CALENDAR DISPLAY

In case that a calendar is displayed on the display screen, the calendar display key 232 provided on the remote control transmitter 230 is operated. The key operation of this calendar display key 232 is detected at the step B2 and then the process defined at the step B10 is performed. At this step B10, both the calendar information and function information are sent from the control unit 19 to the display drive circuit 16 so as to display the calendar of this month on the display unit 17 and the function information, as represented in FIG. 9b. FIG. 9b represents such a condition that the calendar of September, 1989 is being displayed. Then, as the function information when the calendar display mode is designated, there are represented the symbol "—" representative of the function of the first function key F1 on the F1 display region 241; the symbol "+" indicative of the function of the second function key F2 on the F2 display region 242; and the character "END" indicative of the function of the third function key F3 on the F3 display region 243. In other words, it is represented on the display screen in the calendar display mode that the first function key F1 has the function of designating a calendar of a previous month; the second function key F2 has the function of designating a calendar of a next month; and the third function key F3 includes the function of completing the calendar display.

The above-described key operations by the first to third function keys F1 to F3 are detected at the steps B11 to B13, and the process defined at the steps B14 to B16 is performed in accordance with the detection result. That is, when the first function key F1 is operated, this key operation is detected at the step B11 and the process defined at the step B14 is carried out. At this step B14, the calendar of the previous month is displayed and thereafter the process is returned to the step B11, whereby a preparation is made for the subsequent key operation. As a result, when operating the first function key several times, the calendars of the several months before this month are displayed on the display screen in response to the key operation number.

When the second function key F2 is operated, this key operation is detected at the step B12 and thus the process defined at the step B15 is performed. At this step B15, the calendar of the month next to this month is displayed, and thereafter the process is returned to the step B11 at which the subsequent key operation is acceptable. As a consequence, when the second function key F2 is operated several times, the calendars of the several months after this month are displayed in accordance with the plural key operations.

As previously described, a calendar of an arbitrary month may be displayed by operating the first and second function keys F1 and F2 for a confirmation purpose. Then, in case that the above-described calendar display is completed, the third function key F3 is operated. The operation of this third function key F3 is detected at the step B13, and the process as defined at the step B16 is performed. At this step B16, the control unit 19 sends the control instruction to the display drive circuit 16 in order to erase the calendar display and then the normal television image representation is recovered.

It should be noted that although both the timer function and calendar function were added to the portable television receiver according to the second preferred embodiment, other functions may be similarly added thereto.

Also, the functions of the first to third function keys provided on the remote control transmitter 230 were displayed on the display screen in the above-described second preferred embodiment. Alternatively, when the function keys provided on the housing side of the second portable television receiver are manipulated, these functions may be displayed on the display screen.

As previously described in detail, in accordance with the portable television receiver having the remote control function, according to the second preferred embodiment of the present invention, a plurality of functions are allocated to a plurality of function keys employed on the remote control transmitter. When the operation mode to use these function keys is designated, the function content to be allocated to the respective function keys is displayed in this operation mode on the display screen; and when the function key is operated, the process corresponding to the function allocated to this operation key is performed. Accordingly, when operating the function keys, one can be easily confirm the content of the allocated function during this operation mode from the display screen. Then, since it is not required for an operator to remember the plural function contents which have been allocated to the respective function keys, there are particular advantages that the key operation can become very simple and also erroneous key operations can be completely prevented.

ARRANGEMENT OF THIRD PORTABLE TELEVISION RECEIVER INCLUDING AUTOSEARCH FUNCTION

A portable television receiver including an autosearch function according to a third preferred embodiment of the present invention will now be described with reference to FIGS. 1 and 11 to 13. It should be noted that since an entire arrangement of the third portable television receiver is substantially the same as that of the first portable television receiver, only different arrangements thereof will now be explained.

Figure 11:
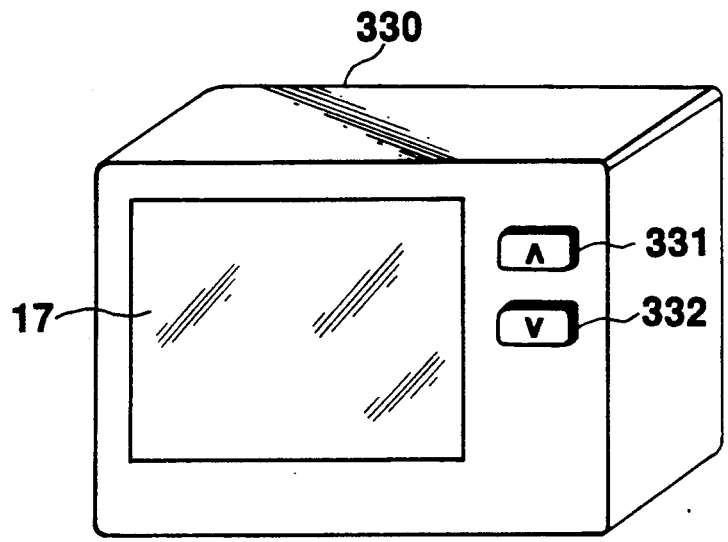
FIG. 11 is a perspective view of a portable television receiver according to the third preferred embodiment.

In FIG. 11, there is shown a perspective view of a main body 330 of the portable television receiver according to the third preferred embodiment of the present invention. Both an up key 331 and a down key 332 are provided together with the above-described display unit 17 on the front face unit of the main body 330.

Figure 12:
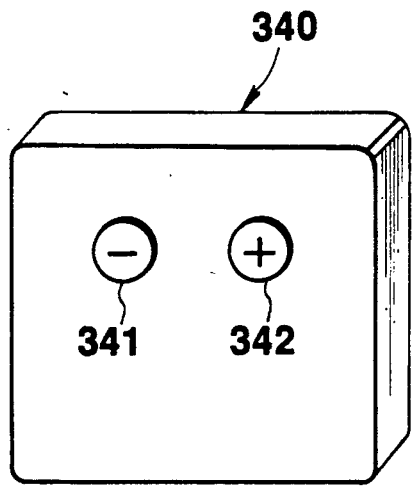
FIG. 12 is a perspective view of a remote controller according to the third preferred embodiment.

Furthermore, to the above-described control unit 19, the remote control signal which has been transmitted from the remote control transmitter 340 shown in FIG. 12 is inputted via the remote control signal light receiving unit 25 and remote control signal receiving unit 26. An up key 341 and a down key 342 are provided together with up/down keys for adjusting a sound level (not shown in detail) on this remote control transmitter 340. The remote control transmitter 340 transmits a light signal, e.g., infrared remote control signal light when the up key 341 and down key 342 are operated.

Thus, the control unit 19 performs the control operation in response to the signal sent from the key input unit 24 or remote control transmitter 340 and, for example, gives a tuning signal TS to the tuner 12; a sound level adjusting signal to a sound level adjusting circuit 21; and a luminance adjusting signal to the display drive circuit 16. In this case, while performing a tuning control to the tuner 12, the control unit 19 judges whether or not the up key 331 and down key 332 of the key input unit 24 have been operated, otherwise whether or not the up key 341 and down key 342 of the remote control transmitter 340 have been manipulated. If the channel selecting key of the key input unit 24 is operated, the channel selecting operation is executed by the autosearch. If the channel selecting key of the remote control transmitter 340 is operated, the channel selecting operation is sequentially performed for each 1 channel.

CHANNEL SELECTING OPERATION

The channel selecting operation under the control of the control unit 19 will now be described in more detail with reference to a flowchart shown in FIG. 13.

Figure 13:
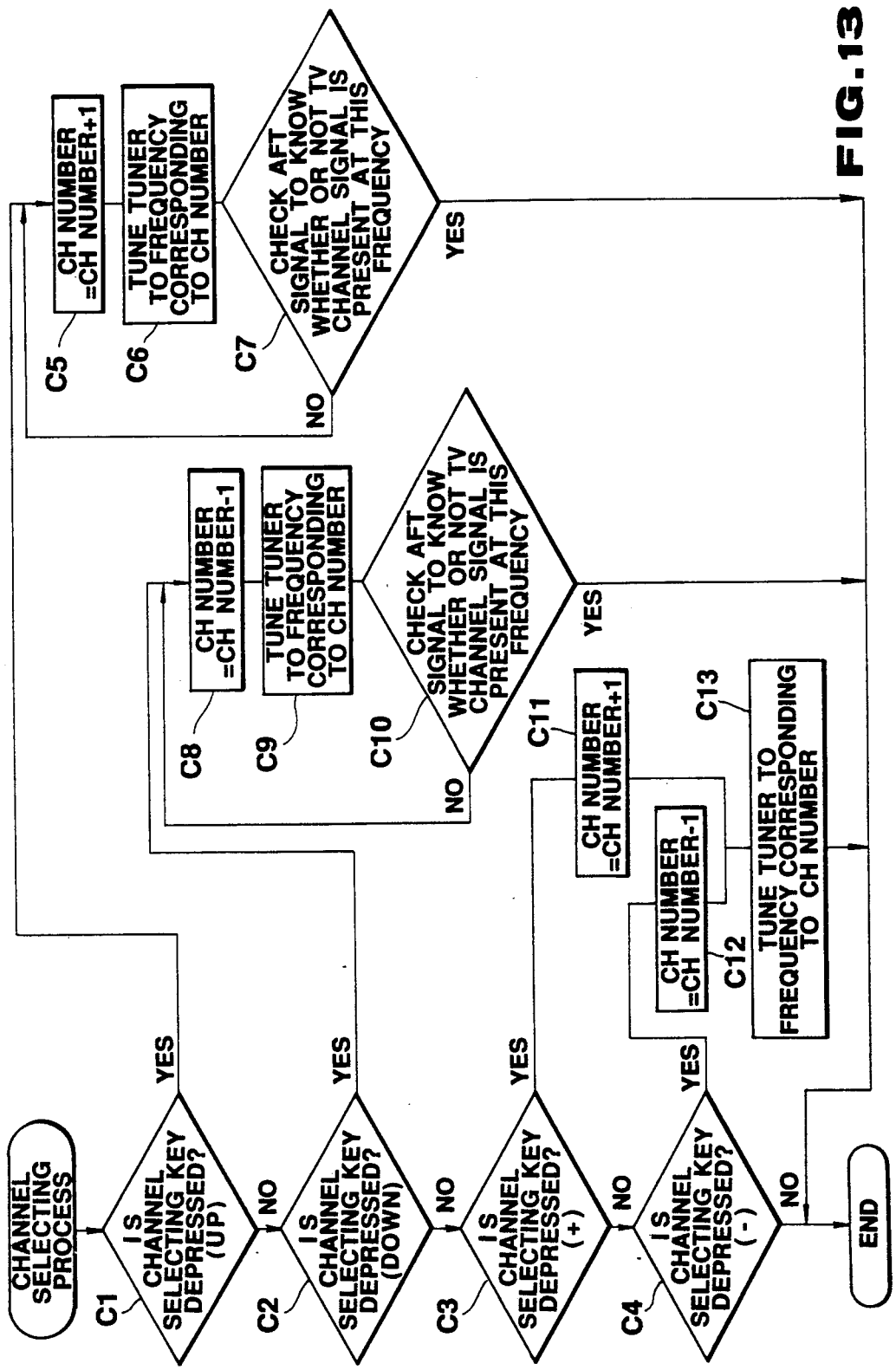
FIG. 13 is a flowchart for explaining a channel selecting operation according to the third preferred embodiment.

Upon operation of the channel selecting key, at steps C1 through C4 in the flowchart of FIG. 13, a judgment is made whether the channel selecting key provided in the key input unit 24 is operated, or the channel selecting key provided in the remote control transmitter 340 is operated. That is, a first judgment is made at the step C1 whether or not the up key 331 provided in the key input unit 24 is manipulated. A second judgment is made at the step A2 whether or not the down key 332 is operated. A further judgment is made whether or not the up key 341 of the remote control transmitter 340 is operated at the step C3. Moreover, another judgment is performed whether or not at the step C4, the down key 342 is operated.

Then, if a judgment is made that the up key 331 in the key input unit 24 is operated at the step C1, the control unit 19 increases the channel number (CH number) which has been selected at this time, by 1 (a step C5), and tunes the tuner 12 to a frequency of the increased channel number (a step C6). In other words, the channel number for selecting the tuner 12 is increased by 1. Under such a circumstance, an AFT signal outputted from the IF amplifier circuit 13 is checked and it is judged whether or not there is a television broadcasting electromagnetic wave in this frequency (a step C7). If no television signal is present on this selected channel, the process is returned to the step C5, at which a channel number designated at this time is increased by 1 so as to designate a subsequent channel. As previously stated, a check is made whether or not there exists a television channel signal at this designated channel at the steps C6 and C7. If YES, then the reception condition of this channel is maintained.

When a judgment result is such that the down key 332 in the key input unit 24 has been manipulated at the step C2, the channel number (CH number) selected at this time is decreased by 1 (a step C8), and the control unit 19 tunes the tuner 12 in the frequency of thus the decreased channel number (step C9). That is to say, the channel number under selection by the tuner 12 is set downward by 1. Under this state, the AFT signal outputted from the IF amplifier circuit 13 is checked and it is judged whether or not a relevant television channel signal is present at this frequency (a step C10). If no relevant TV channel signal is present therein, the process is returned to the previous step C8, at which the channel number designated at this time is decreased by 1. Thus, as previously described, a check is made at the steps C9 and C10 whether or not a relevant TV broadcasting signal is present at the designated channel, and if YES, then the reception condition for this channel is maintained.

As explained above, when either the up key 331 or down key 332 of the key input unit 24 is operated, the receivable TV broadcasting stations may be automatically selected by the autosearch operation.

On the other hand, at the step C3, if a judgment is effected that the up key 341 of the remote control transmitter 340 has been operated, the channel number (CH number) being selected at this time is increased by 1 (a step C11), and the tuner 12 is tuned to the frequency of this increased channel number, whereby the channel selecting operation is completed (step C13).

At the step C4, if a judgment is made that the down key 342 of the remote control transmitter 340 has been operated, the channel number (CH number) being selected at this time is decreased by 1 (a step C12), and the tuner 12 is tuned to the frequency of the decreased channel number, whereby the channel selecting operation is accomplished (a step C13).

As previously described, in case that either the up key 341 or the down key 342 of the remote control transmitter 340 is operated, the channel selecting operation is successively performed by 1 channel unit by operating the channel selecting key.

As represented in the above-described third preferred embodiment, when the channel selecting key provided on the main body of the portable TV receiver is operated, the channel selecting operation is carried out by the autosearch operation. When the channel selecting key provided on the remote control transmitter 340 is manipulated, the channel selecting operation is sequentially effected every 1 channel. Accordingly, two channel selecting modes may be freely selected without employing any mode changing switch. Furthermore, it is not necessary to previously confirm which channel selecting mode has been set.

It should be noted that in the above-described third preferred embodiment, when the channel selecting key provided in the television receiver main body 330 was operated, the autosearch operation was carried out, and also when the channel selecting key provided on the remote control transmitter 340 was operated, the channel selecting operation was sequentially performed every 1 channel. Conversely, when the channel selecting key of the TV receiver main body is operated, the channel selecting operation may be successively carried out by 1 channel, whereas when the channel selecting key of the remote control transmitter 340 is manipulated, the autosearch may be executed, which can provide a particular advantage similar to that of the previously explained preferred embodiment.

As previously described in detail, the portable TV receiver according to the third preferred embodiment of the present invention comprises a first channel selection controlling means for automatically searching the receivable TV stations by operating the channel selecting key, and also a second channel selection controlling means for sequentially selecting the TV stations every one TV channel. The first and second channel selection controlling means are set with respect to the channel selecting key of the TV receiver main body and the channel selecting key of the remote control transmitter in accordance with an opposite relationship therebetween, such that when the channel selecting key corresponding to the first channel selection controlling means is operated, a desirable TV station may be easily selected in the autosearch mode. Furthermore, with respect to such a TV station which could not searched in the autosearch mode due to bad receiving conditions, the channel selecting key corresponding to the second channel selection controlling means is operated, whereby the desirable TV channel may be received. Consequently, the third preferred embodiment may provide very easy channel selecting methods with a simple channel selecting operation.

ARRANGEMENT OF FOURTH PORTABLE TV RECEIVER WITH REMOTE ON/OFF CONTROL

Referring now to FIGS. 14 to 19, a portable TV receiver according to a further preferred embodiment of the present invention.

Figure 14:
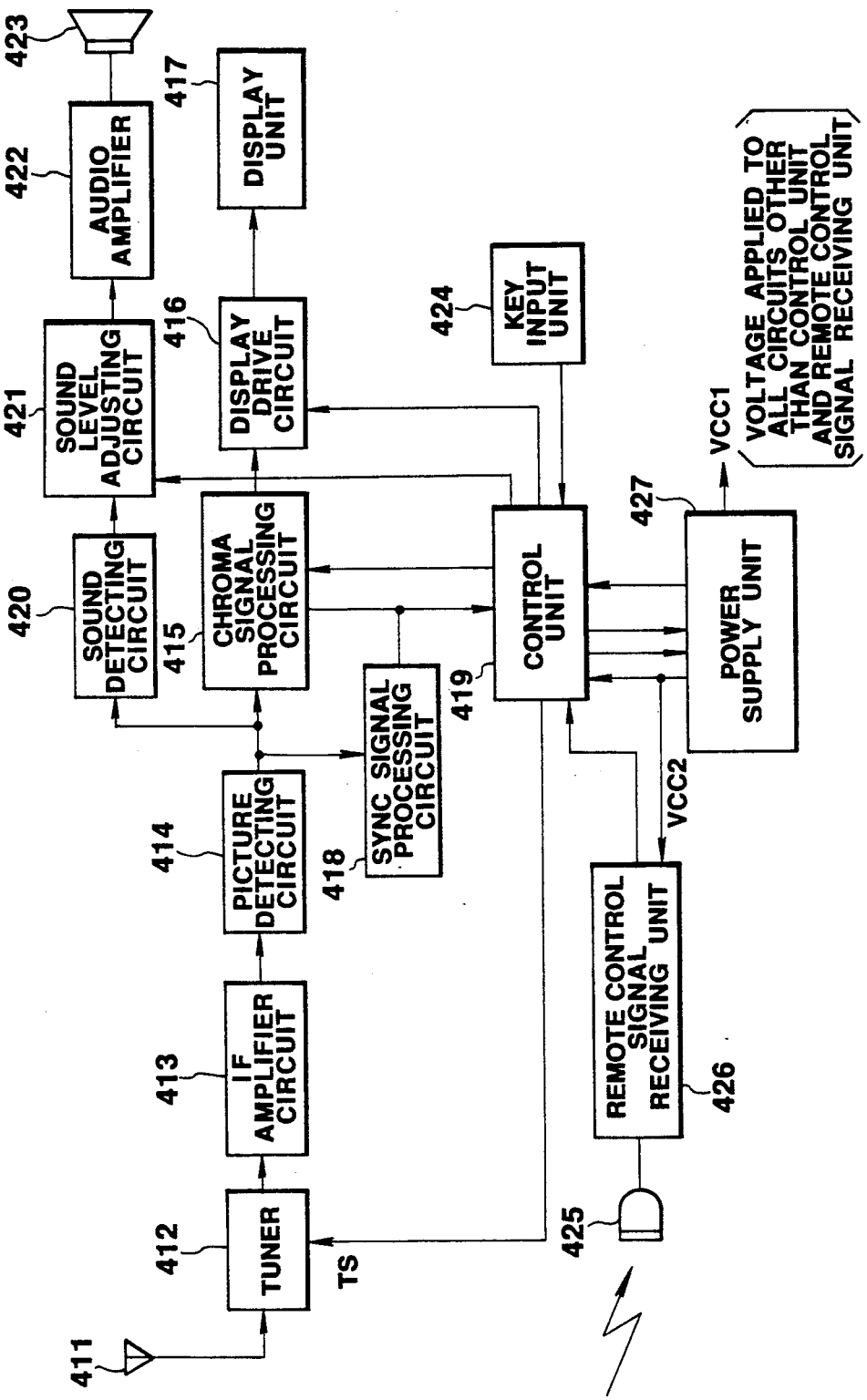
FIG. 14 is a schematic block diagram of a portable television receiver according to a fourth preferred embodiment of the present invention.

In FIG. 14, there is shown a circuit block diagram of the fourth portable TV receiver. An antenna 411 is employed to receive television broadcasting electromagnetic waves (otherwise, simply referred to as "TV channel signals"). The received TV channel signals are inputted into a tuner 412. The tuner 412 selects a designated TV channel signal in response to a tuning signal "TS" delivered from a control unit 419, and converts the selected TV channel signal into a corresponding intermediate frequency signal which will then be supplied to an intermediate amplifier circuit 413. The function of the intermediate frequency amplifier circuit 413 is to amplify the intermediate frequency signal sent from the tuner 412 so as to output the amplified IF (intermediate frequency) signal to a picture detecting circuit 414, and also to AFT-detect a portion of this amplified IF signal to produce an AFT (automatic frequency tuning) signal which will be outputted to the control unit 419. The picture detecting circuit 414 detects the IF signal supplied from the IF amplifier circuit 413 and outputs the picture detected IF signal to both a chroma (chrominance) signal processing circuit 415 and also a sync (synchronous) signal processing circuit 418. The sync signal processing circuit 418 separates a horizontal sync signal and a vertical sync signal from the picture signal furnished from the picture detecting circuit 414, and outputs both of these sync signals to the chroma signal processing circuit 415 and control unit 419. Also to the chroma signal processing circuit 415, a control signal is supplied from the control unit 419.

In response to the sync signal from the sync signal processing circuit 418 and the control signal from the control unit 419, the chroma signal processing circuit 415 performs a chroma signal processing for the picture signal to output three color signals R, G and B to a display drive circuit 416. The display drive circuit 416 drives a display unit 417 in response to a timing signal and a luminance signal furnished from the control unit 419. A color liquid crystal display panel, for instance, may be utilized as this display unit 417.

A portion of the output signal from the picture signal detecting circuit 414 is sent to a sound detecting circuit so as to be sound-detected, thereby producing a sound or audio signal. The audio signal is thereafter supplied to a sound level adjusting circuit 421. The sound level of this audio signal is adjusted and then supplied to an audio amplifier circuit 422, whereby a television sound is produced from a speaker 423.

A key input unit 424 is also connected to the control unit 419. There are provided on this key input unit 424, up/down keys for selecting TV channels; up/down keys for controlling the sound level; up/down keys for controlling the luminance level power ON/OFF switch; and so on.

A remote control signal transmitted from a remote control transmitter is inputted via a remote control signal light receiving unit 425 and a remote control signal receiving unit 426 to the control unit 419 in accordance with the first preferred embodiment. On this remote control transmitter, there are provided, for example, television operating keys and a power switch, similar to the key input unit 424.

Also, a power supply unit 427 is connected to the control unit 419. The power supply unit 427 generates two power supply voltages $V_{cc1}$ and $V_{cc2}$. The first power supply voltage $V_{cc1}$ is applied via a first power supply line 428 to all circuit units other than the control unit 419 and remote control signal receiving unit 426. The second power supply voltage $V_{cc2}$ is applied via a second power supply line 429 to the control unit 419 and remote control signal receiving unit 426. The power supply unit 427 produces these two power supply voltages $V_{cc1}$ and $V_{cc2}$ in response to the operations of the power switches employed in the fourth portable television receiver's main body and remote control transmitter.

INTERNAL CIRCUIT OF POWER SUPPLY UNIT

An internal circuit arrangement of the power supply unit will now be described more in detail.

Figure 15:
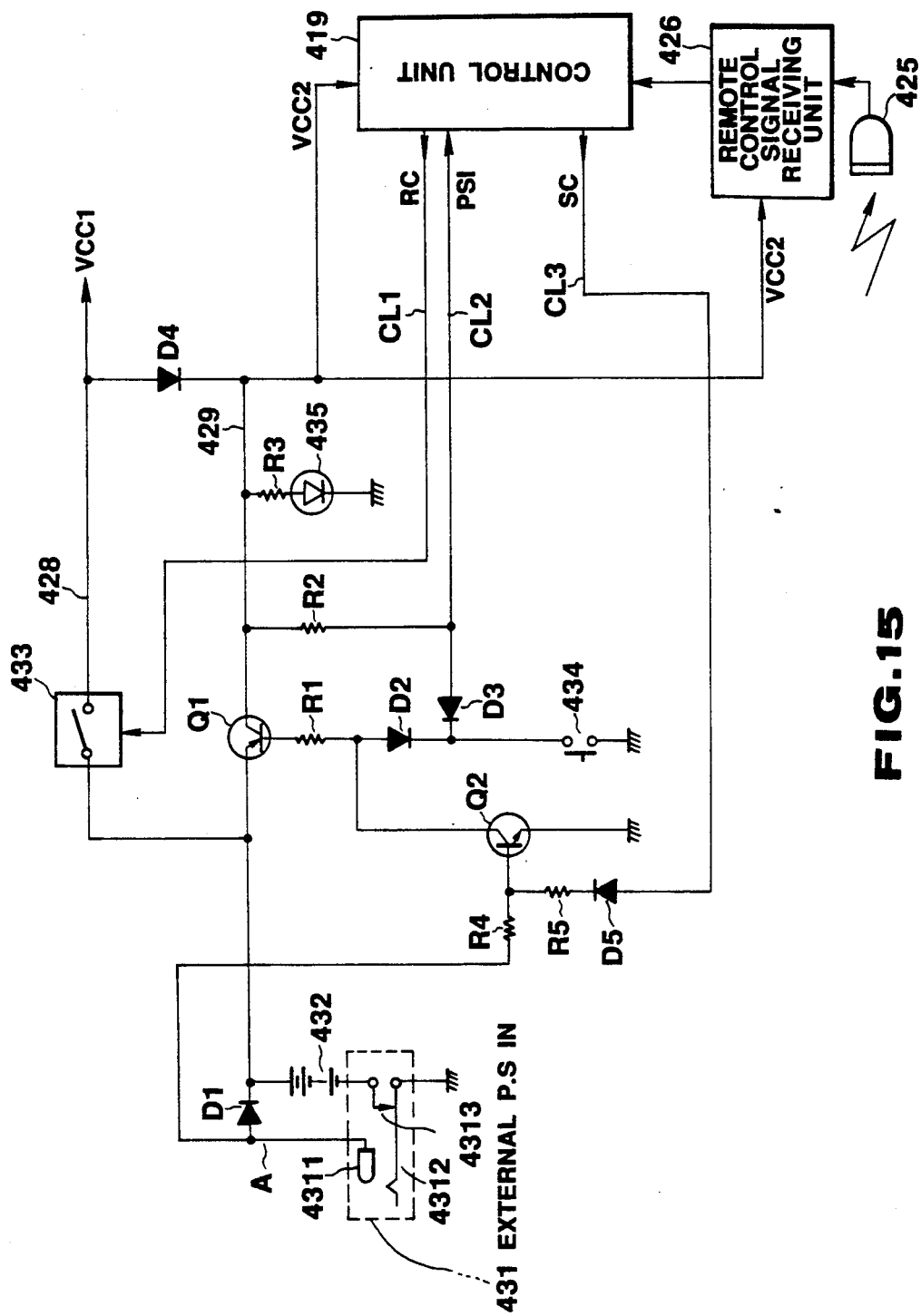
FIG. 15 is a circuit diagram of a power supply unit employed in the television receiver shown in FIG. 14.

The overall circuit arrangement of the power supply unit 427 is so constructed as shown in FIG. 15. In this figure, an external power supply input terminal 431 is constructed of three contact pieces 4311, 4312 and 4313. The second contact piece 4312 is made of an elastic member and is normally in contact with the third contact piece 4313 under certain pressure. When an external power supply plug (not shown) is inserted into the external power supply input terminal 431, a positive (+) terminal thereof is in contact with the first contact piece 4311 and a negative (−) terminal thereof is in contact with the second contact piece 4312 under certain pressure, which in turn causes the second contact piece 4312 to be separated from the third contact piece 4313. Then the first contact piece 4311 of the external power supply input terminal 431 is connected to a positive terminal of a battery 432 via a reverse current preventing diode D1 in a forward direction, the second contact piece 4312 is connected to a ground line, and the third contact piece 4313 is connected to a negative terminal of the battery 432.

A positive voltage of this battery 432 is applied via a relay 433 as the first voltage $V_{cc1}$ to the first power supply line 428. The relay 433 is turned ON/OFF in response to a relay control signal RC which is supplied from the control unit 419 via a signal line CL1. Furthermore, the positive voltage of the battery 432 is applied as the second power supply voltage $V_{cc2}$ to the second power supply line 429 via an emitter-to-collector path of a PNP transistor Q1, which will be furnished to the control unit 419 and remote control signal receiving unit 426. A base electrode of this transistor Q1 is grounded via a resistor R1, a forward-connected diode D2, and a power switch 34. This power switch 34 is turned ON only when being depressed, and is turned OFF when being not depressed. A collector of a transistor Q2 is connected via a resistor R2 and a diode D3 to a junction between the diode D2 and power switch 434. A voltage appearing at the junction between the resistor R2 and diode D3 is delivered as a power switch judging signal PS2 via a signal line CL2 to the control unit 419. LED (light emitting diode) 435 is provided through the resistor R3 between the second power supply line 429 and ground. The function of this LED 435 is to indicate whether or not the remote control signal is acceptable. When the remote control signal is acceptable, the LED 435 is turned ON. A diode D4 is connected between the first power line 428 and second power line 429. In this case, a diode D4 is provided in such a manner that an anode thereof is connected to the first power supply line 428. A junction between the resistor R1 and diode D2 is connected to the collector of the NPN transistor Q2. An emitter of this transistor Q2 is grounded and a base electrode thereof is connected via the resistor R4 to the first contact piece 4311 of the external power supply input terminal 431. To the base electrode of this transistor Q2, a standby control signal "SC" outputted from the control unit 419 to the signal line CL3 is inputted via a diode D5 and a resistor R5. That is to say, the transistor Q2 is turned ON/OFF in response to the standby control signal SC outputted from the control unit 419 to the signal line CL3, or the external power supply connecting state of the external power input terminal 431. Further, this transistor Q2 enables the transistor Q1 to be turned ON/OFF. The control unit 419 continuously keeps this standby control signal SC at a high level while the power supply is turned ON, and then maintains this high level of the standby control signal SC only for a predetermined time period ("N" minutes) when the power supply is turned OFF and thereafter sets it to a low level.

OUTER APPEARANCES OF THIRD PORTABLE TELEVISION AND REMOTE CONTROL TRANSMITTER

In FIG. 16, there is shown an outer appearance of the third portable television receiver's main body 440. The display unit 417, speaker 423, LED 435 and the like are provided on a front face of this receiver, the external power supply input terminal 431 is provided on a side face thereof, and the power switch 434 is provided on a top face. Although not shown in FIG. 16, tuning keys and various adjusting keys are provided on the portable television receiver's main body 440.

An outer appearance of the remote control transmitter 441 is represented in FIG. 17. Tuning keys and various adjusting keys together with the power switch 442 for turning ON/OFF the third portable TV receiver are provided on this remote control transmitter 441.

POWER ON/OFF CONTROL OF FOURTH TV RECEIVER

Referring now to the timing charts of FIGS. 18(a)-18(l), the power ON/OFF control of the portable TV receiver according to the fourth preferred embodiment of the present invention will be described.

First, operation of the fourth TV receiver under use of the external power supply will now be described. When the external power supply is utilized, since the external power source plug is inserted into the external power supply input terminal 431, the second contact piece 4312 of the external power supply input terminal 431 (see FIG. 15) is separated from the third contact piece 4313 so that the built-in battery is electrically cut away from the main TV circuit. Then, the potential at the point A derived from the first contact piece 4311 of the external power supply input terminal 431 becomes a high level (FIG. 18(a)) and the NPN transistor Q2 is turned ON (FIG. 18(g)). Since this transistor Q2 is turned ON, the ground potential is applied via the resistor R1 to the base electrode of the PNP transistor Q1. As a result, the transistor Q1 is turned ON (FIG. 18(d)), and the external power supply's positive voltage inputted from the first contact piece 4311 is outputted via the transistor Q1 to the second power supply line 29 as $V_{cc2}$ (FIG. 18(e))). As previously stated, while the external power supply is used, both the transistors Q2 and Q1 are continuously turned ON, and the power supply voltage $V_{cc2}$ derived via the transistor Q1 is applied to the control unit 19 and remote control signal receiving unit 426. As a consequence, the remote control signal receiving unit 426 is brought into such a state that the remote control signal transmitted from the remote control transmitter 441 can be received, namely a standby condition. At this time, LED435 is turned ON by receiving the above-described second power supply voltage $V_{cc2}$ (FIG. 18(l)), which represents that the remote control signal is receivable.

On the other hand, when the power switch 434 of the fourth portable TV receiver 440 is manipulated (FIG. 18(b)), the power switch judging signal PSI appearing on the signal line CL2 becomes a low level during the manipulation thereof. A variation of this potential is detected by the control unit 419.

The control unit 419 controls the power supply employed in the fourth TV receiver in main body 440 to be turned ON/OFF in response to either the operation signal of the power switch 442 transmitted from the remote control transmitter 441, or the judging signal PSI of the power switch 434 employed on the main body 440, which is supplied via the signal line CL2.

More specifically, when no first power supply voltage $V_{cc1}$ is outputted to the first power supply line 428, the control unit 419 sets the relay control signal RC (FIG. 18(h)) to be outputted to the signal line CL1 to be a high level if either the power switch 434 employed on the main body 440 of the TV receiver, or the power switch 442 employed in the remote control transmitter 441, and also turned ON the relay 433, whereby the first power supply voltage $V_{cc1}$ is outputted to the first power line 428. This power supply voltage $V_{cc1}$ is furnished to all of the circuits other than the control unit 419 and remote control signal receiving unit 426, so that the TV receiving operation is commenced.

While the first power supply voltage $V_{cc1}$ is outputted to the first power supply line 428, the control unit 419 enables the relay control signal RC to be outputted to the signal line. CL1 is at a low level when either the power switch 434 employed on the main body 440 of the TV receiver, or power switch 442 of the remote control transmitter 441 is operated. Also, the control unit 419 turned OFF so that the supply of the first power supply voltage $V_{cc1}$ to the first power supply line 428 is interrupted. As a result, although the TV receiving operation is interrupted, since the second power supply voltage $V_{cc2}$ is being applied to the control unit 419 and remote control signal receiving unit 426, it is possible to receive the operation signal of the power switch 442 transmitted from the remote control transmitter 441.

On the other hand, the control unit 419 sets the standby control signal to the high level, which is outputted to the signal line CL3 under state that the power supply is turned ON. When the power supply is turned OFF, the control unit 419 starts the timer operation and then sets the standby control signal SC to a low level (FIG. 18(f)) if this power-OFF condition is continued for a predetermined N minutes. However, when the external power supply is being used as previously described, since the potential appearing at the point "A" is held at the high level, the transistors Q2 and Q1 are turned ON, namely the standby condition (FIG. 18(j)) is maintained. In other words, during the use of the external power supply, the power supply of the main body 440 of the fourth portable TV receiver may be turned ON/OFF by operating not only the power switch 434 employed on the main body 440, but also the power switch 442 employed on the remote control transmitter 441.

BUILT-IN BATTERY OPERATION

Operations of the fourth portable TV receiver will now be described when the built-in battery 432 is used.

When the built-in battery 432 is used, since no external power supply plug is inserted into the external power supply input terminal 431, the second contact piece 4312 is in contact with the third contact piece 4313 in predetermined pressure, and the negative polarity terminal of battery 432 is grounded. As a result, the voltage across the battery 432 is applied to the transistor Q1 and relay 433. At this time, the potential at the point A (first contact piece 4311) is maintained at a low level. Under the initial condition, the standby control signal SC outputted from the control unit 419 to the signal line CL32 becomes a low level and thus both the transistors Q2 and Q1 are turned OFF.

Under this condition, when the power switch 434 employed on the main body of the fourth portable TV receiver is operated (FIG. 18(b)), the bias circuit of the transistor Q1 is turned ON (FIG. 18(d)) and the second power supply voltage $V_{cc2}$ is applied via the second power supply line 429 to the control unit 419 and remote control signal receiving unit 426. Thus, the control unit 419 starts its operation and outputs the standby control signal SC to the signal line CL3 in order to turn ON the transistor Q2 (FIG. 18(g)), and further outputs the relay control signal RC to the signal line CL1 so as to turn ON the relay 433 whereby the first power supply voltage $V_{cc1}$ is applied to the first power line 28. In this case, the control unit 419 outputs the standby control signal SC to the signal line CL3 before the power switch 434 on the main body 440 is turned OFF in order to turn ON the transistor Q2, and this ON-state of the transistor Q2 is required to be maintained. When the above-described processes, the fourth TV receiver circuit is brought into the operation condition, whereby the TV reception condition is prepared. Under this condition, LED435 is turned ON by the supply of the above-described second power supply voltage $V_{cc2}$, so that an indication is made that the remote control signal may be received.

As previously described, once the power supply of the fourth TV receiver's main body 440 is turned ON, not only the power switch 434 provided on this main body 440 but also the power switch 442 provided on the remote control transmitter 441 enable the power supply of the fourth portable TV receiver to be turned ON/OFF (FIG. 18(c)).

As explained above, when the built-in battery 432 is operated as the power source for this TV receiver, if the OFF-state of this power supply, namely the standby condition is continued for the N minutes, the control unit 419 sets the standby control signal SC outputted to the signal line CL3 to be a low level. At this time since the potential appearing at the point A is maintained at the low level, once the standby control signal SC becomes a low level, the transistor Q2 is turned OFF. As a consequence, the transistor Q1 is also turned OFF and the supply of the second power supply voltage $V_{cc2}$ to the control unit 419 and remote control signal receiving unit 426 is interrupted (FIG. 18(e)) and also LED435 is turned OFF (FIG. 18(a)). Under such a condition that this LED 435 is turned OFF, no remote control signal is accepted and thus the power supply of the main body can be turned ON/OFF by operating only the power switch 434 employed on the main body.

FIGS. 19(a)) to 19(c)) show the case that the built-in battery 432 is being used as the power supply of the TV receiver, under the respective conditions of "power ON" "standby" and "power OFF" of the fourth portable TV receiver's main body 440; "whether or not LED35 is turned ON", "whether or not the remote control signal is received", "relationship of high/lower power consumption", and the like. Under the standby condition capable of receiving the remote control signal, since the second power supply voltage $V_{cc2}$ is applied only to the control unit 419 and remote control signal receiving unit 426, the resulting power consumption becomes low.

Also, since the supply of the second power supply voltage $V_{cc2}$ is interrupted after N minutes have passed under the standby condition, the power consumption becomes zero.

As previously described in detail, in the portable television receiver equipped with the remote controller according to the fourth preferred embodiment of the present invention, the power switch for turning ON/OFF the power supply of this receiver is employed on the remote controller. When this power supply is turned OFF in the case that this receiver is operated by the built-in battery power supply, the power supply voltage is applied to the control unit and remote control signal receiving unit for a predetermined time period after the power supply is turned OFF. Accordingly, since such a standby condition capable of receiving the power supply switch operating signal transmitted from the remote control transmitter is maintained, the power supply of the TV receiver can be turned OFF at any time when the power supply of the TV receiver is turned ON. Also, even when the power supply is turned OFF and this OFF-state is within a predetermined time period, the power supply can be turned OFF by operating the remote controller. In general, in a portable TV receiver, there are many possibilities that the power supply is again turned ON within a short time period after the power supply is once turned OFF. Accordingly, if the power supply of the TV receiver can be turned ON only a predetermined time period after the power supply is turned OFF, it becomes very convenient for TV receiver operation. Under the above-described standby condition, since only the control unit and remote control signal receiving unit consume power, the resultant power consumption becomes low. Then, after a predetermined time period has elapsed, all of the power supplies are turned OFF and the resultant power supply becomes zero. Even when the portable TV receiver operable under the built-in battery is used, the total power consumption does not become so high and the power supply thereof can be controlled by the remote controller.

What is claimed is:

1. A television receiver equipped with a remote controller, comprising:
   a plurality of channel designating keys, provided in said remote controller, for transmitting remote control signals corresponding to said plurality of control designating keys;
   a display designating key, provided in said remote controller, for transmitting a display designating signal;
   allocation means, provided at said television receiver, for allocating information on broadcasting stations to the remote control signals corresponding to the location of said channel designating keys; and
   display means, provided at said television receiver, for displaying on a display screen the broadcasting information allocated to each of said channel designating keys employed in said remote controller under such a display arrangement which is the same as a key arrangement of said channel designating keys employed in said remote controller, in response to said display designating signal produced from said remote controller.

2. A television receiver as claimed in claim 1, wherein said information is allocated to said remote control signals of said plurality of channel designating keys in a one-to-one correspondence.

3. A television receiver as claimed in claim 1, wherein the displayed information on said display means is displayed by an arrangement of said channel designating keys and a screen position of said allocated information.

4. A television receiver as claimed in claim 3, wherein said information is indicated by channel numbers of the television broadcasting stations.

5. A television receiver as claimed in claim 1, further comprising:
   storage means for storing corresponding relationships between said channel designating keys and said allocated information of the broadcasting stations.

6. A television receiver as claimed in claim 1, wherein said display means comprises a display means of a television picture.

7. A television receiver as claimed in claim 1, wherein said broadcasting information is superimposed on said television picture.

8. A portable television receiver as claimed in claim 6, wherein said broadcasting information is displayed in plural colors.

9. A television receiver as claimed in claim 1, wherein said television receiver is a portable television receiver.

10. A television system, comprising:
    a television receiver equipped with display means for displaying a television image, said display means being powered by a power source;
    a remote controller including at least a power-ON/OFF instruction key for controlling the television receiver, and for transmitting at least a first remote control signal to instruct the television receiver to be turned ON and a second remote control signal to instruct the television receiver to be turned OFF;
    remote control signal receiving means, provided at said television receiver, for receiving said first and second remote control signals from said remote controller;
    time counting means, provided at said television receiver, for counting time; and
    control means, coupled to said remote control signal receiving means and to said time counting means, for turning OFF at least said power source of said display means when receiving said second remote control signal to instruct the power-OFF operation from said remote controller, and for simultaneously commencing operation of said time counting means, and, when said time counting means having counted up a predetermined time period, a power supply of the entire television receiver is turned OFF by said control means; and
    wherein said control means turns ON said power source of said display means when said remote control signal receiving means receives said first remote control signal to instruct a power-ON function from said remote controller while said time counting means counts up said predetermined time period.

11. A television receiver as claimed in claim 10, wherein said control means turns OFF said portable television receiver except for said remote control signal receiving means, said time counting means and said control means when receiving the remote control signal to instruct the power-OFF from said remote controller.

12. A television system as claimed in claim 10, wherein said television receiver is a portable television receiver.

13. A television receiver equipped with a remote controller, comprising:
    a plurality of function keys, provided in said remote controller, for transmitting remote control signals corresponding to the respective function keys which designate respective functions;
    remote control signal receiving means, provided at said television receiver, for receiving the remote control signals derived from the remote controller;
    allocation means, provided at said television receiver, for allocating functions to said received remote control signals corresponding to the respective functions;
    storage means provided at said television receiver for storing therein a program to execute the allocated functions;
    display means, provided at said television receiver, for displaying on a display screen, function information allocated to the respective function keys under such a display arrangement which is the same as a key arrangement of said function keys employed in said remote controller; and
    control means, coupled to said storage means employed in said television receiver, for executing the function allocated to the received remote control signal when the remote control signal corresponding to said function key is received by the remote control signal receiving means.

14. A television receiver equipped with a remote controller as claimed in claim 13, further comprising:
   display means for displaying allocated contents of said allocation means.

15. A television receiver equipped with a remote controller as claimed in claim 4, wherein said display means displays a television picture.

16. A television receiver as claimed in claim 13, wherein said television receiver is a portable television receiver.

* * * * *